United States Patent
Kameda et al.

(10) Patent No.: US 8,233,065 B2
(45) Date of Patent: Jul. 31, 2012

(54) CHARGE DETECTION DEVICE AND CHARGE DETECTION METHOD, SOLID-STATE IMAGING DEVICE AND DRIVING METHOD THEREOF, AND IMAGING DEVICE

(75) Inventors: Shunsuke Kameda, Kumamoto (JP); Nobuhiro Karasawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 339 days.

(21) Appl. No.: 12/656,001

(22) Filed: Jan. 13, 2010

(65) Prior Publication Data

US 2010/0201861 A1    Aug. 12, 2010

(30) Foreign Application Priority Data

Feb. 10, 2009 (JP) ................................. 2009-028892

(51) Int. Cl.
*H04N 3/14* (2006.01)
*H04N 5/335* (2011.01)

(52) U.S. Cl. ........ 348/294; 348/298; 348/302; 348/308; 348/312

(58) Field of Classification Search ............. 348/294, 348/298, 302, 308, 312; 250/208.1; 257/290–292; 438/57, 59, 60, 69, 73, 75, 77, 93, 94
See application file for complete search history.

(56) References Cited

U.S. PATENT DOCUMENTS

| | | | |
|---|---|---|---|
| 6,512,547 B1 * | 1/2003 | Miida | 348/310 |
| 6,950,134 B2 * | 9/2005 | Miida | 348/294 |
| 2004/0245433 A1 * | 12/2004 | Koyama | 250/208.1 |
| 2005/0285165 A1 * | 12/2005 | Ohkawa et al. | 257/292 |

FOREIGN PATENT DOCUMENTS

JP 10-041493 2/1998

* cited by examiner

*Primary Examiner* — Yogesh Aggarwal
(74) *Attorney, Agent, or Firm* — Rader Fishman & Grauer, PLLC

(57) ABSTRACT

A charge detection device includes: a substrate having a first conductive type of predetermined region; a second conductive type of drain region disposed in the predetermined region of the substrate; a second conductive type of source region disposed in the predetermined region of the substrate; a second conductive type of channel region disposed between the drain region and the source region; a gate formed via an insulating film on the channel region; a second conductive type of charge accumulation region disposed in the predetermined region of the substrate and changing a threshold voltage of a transistor having the drain region, the source region, and the gate by accumulating signal charges as a target to be measured; a first conductive type of channel barrier region disposed between the channel region and the charge accumulation region; and a charge sweep region sweeping away the signal charges accumulated in the charge accumulation region.

6 Claims, 6 Drawing Sheets

CHARGE DETECTION DEVICE AND CHARGE DETECTION METHOD, SOLID-STATE IMAGING DEVICE AND DRIVING METHOD THEREOF, AND IMAGING DEVICE

BACKGROUND OF THE INVENTION

1. Field of the Invention

The present invention relates to a charge detection device and a charge detection method, a solid-state imaging device and a driving method thereof, and an imaging device. More particularly, the present invention relates to a charge detection device and a charge detection method which detect accumulated signal charges by changing a threshold voltage of a transistor, a solid-state imaging device using the charge detection device and a driving method thereof, and an imaging device using the solid-state imaging device.

2. Description of the Related Art

A solid-state imaging device may be roughly classified into a CCD (Charge Coupled Device) type image sensor and a CMOS (Complementary MOS) type image sensor. In the solid-state imaging device, FD (Floating Diffusion), FG (Floating Gate), or BCD (Bulk Charge Detection) is used for a charge detection device when converting signal charges into a voltage signal.

Here, the FD may not avoid KTC noise due to thermal fluctuation in charges because of its structure. On the other hand, the BCD is the non-destructive read, thereby removing the KTC noise.

FIG. 9 is a schematic diagram illustrating the configuration of a solid-state imaging device using the BCD of the related art.

In the solid-state imaging device illustrated here, an annular gate 101 constituting a transistor is formed and an N$^+$-type source region 104 is formed on the surface of an N-type well 103 of a P-type substrate 102 corresponding to a center opening between gates. An N$^+$-type drain region 105 is formed on the N-type well 103 corresponding to the periphery of the gate 101. An annular P-type channel region 106 is formed between the source region 104 and the drain region 105, and an annular N$^+$-type charge accumulation region 107 is formed below the channel region 106 (for example, see JP-A-10-41493).

In the solid-state imaging device constituted as described above, a threshold voltage of the transistor is changed by signal charges accumulated in the charge accumulation region 107, and a resistance value between the gate and the drain is changed. Therefore, the signal charges accumulated in the charge accumulation region 107 may be detected by measuring the potential of the source. The signal charges are swept into the drain region 105 by applying a reset voltage thereto when the detection has been completed.

SUMMARY OF THE INVENTION

However, a gate area is increased and the efficiency of conversion from signal charges into a voltage is decreased in BCD for which a gate is constituted in an annular shape.

Thus, it is desirable to provide a charge detection device and a charge detection method, a solid-state imaging device and a driving method thereof, and an imaging device that can realize high conversion efficiency.

According to an embodiment of the present invention, a charge detection device includes a substrate having a first conductive type of predetermined region, a second conductive type of drain region disposed in the predetermined region of the substrate, a second conductive type of source region disposed in the predetermined region of the substrate, a second conductive type of channel region disposed between the drain region and the source region, a gate formed via an insulating film on the channel region, a second conductive type of charge accumulation region disposed in the predetermined region of the substrate and changing a threshold voltage of a transistor having the drain region, the source region, and the gate by accumulating signal charges as a target to be measured, a first conductive type of channel barrier region disposed between the channel region and the charge accumulation region, and a charge sweep region sweeping away the signal charges accumulated in the charge accumulation region.

According to another embodiment of the present invention, a charge detection method includes the steps of accumulating signal charges as a target to be measured in a second conductive type of charge accumulation region disposed in a first conductive type of predetermined region provided in a substrate, detecting a change of a threshold voltage occurring in a transistor by accumulating the signal charges in the charge accumulation region, wherein the transistor includes a second conductive type of drain region disposed in the predetermined region of the substrate, a second conductive type of source region disposed in the predetermined region of the substrate, and a gate formed via an insulating film on a second conductive type of channel region disposed between the drain region and the source region, wherein a first conductive type of channel barrier region is disposed between the channel region and the charge accumulation region, and sweeping the signal charges accumulated in the charge accumulation region into a charge sweep region different from the drain region.

According to still another embodiment of the present invention, a solid-state imaging device includes a substrate having a first conductive type of predetermined region, a photoelectric conversion element disposed in the predetermined region of the substrate and generating signal charges in response to incident light, a second conductive type of drain region disposed in the predetermined region of the substrate, a second conductive type of source region disposed in the predetermined region of the substrate, a second conductive type of channel region disposed between the drain region and the source region, a gate formed via an insulating film on the channel region, a second conductive type of charge accumulation region disposed in the predetermined region of the substrate and changing a threshold voltage of a transistor having the drain region, the source region, and the gate by accumulating the signal charges generated by the photoelectric conversion element, a first conductive type of channel barrier region disposed between the channel region and the charge accumulation region, and a charge sweep region sweeping away the signal charges accumulated in the charge accumulation region.

According to yet another embodiment of the present invention, a method of driving a solid-state imaging device includes the steps of generating signal charges in response to incident light by a photoelectric conversion element disposed in a first conductive type of predetermined region provided in a substrate, accumulating the signal charges generated by the photoelectric conversion element in a second conductive type of charge accumulation region disposed in the predetermined region of the substrate, detecting a change of a threshold voltage occurring in a transistor by accumulating the signal charges in the charge accumulation region, wherein the transistor includes a second conductive type of drain region disposed in the predetermined region of the substrate, a second conductive type of source region disposed in the predetermined region of the substrate, and a gate formed via an insulating film on a second conductive type of channel region disposed between the drain region and the source region, wherein a first conductive type of channel barrier region is disposed between the channel region and the charge accumulation region, and sweeping the signal charges accumulated in the charge accumulation region into a charge sweep region different from the drain region.

According to further another embodiment of the present invention, an imaging device includes a solid-state imaging device and an optical system guiding incident light to a photoelectric conversion element, wherein the solid-state imaging device includes a substrate having a first conductive type of predetermined region, the photoelectric conversion element disposed in the predetermined region of the substrate and generating signal charges in response to the incident light, a second conductive type of drain region disposed in the predetermined region of the substrate, a second conductive type of source region disposed in the predetermined region of the substrate, a second conductive type of channel region disposed between the drain region and the source region, a gate formed via an insulating film on the channel region, a second conductive type of charge accumulation region disposed in the predetermined region of the substrate and changing a threshold voltage of a transistor having the drain region, the source region, and the gate by accumulating the signal charges generated by the photoelectric conversion element, a first conductive type of channel barrier region disposed between the channel region and the charge accumulation region, and a charge sweep region sweeping away the signal charges accumulated in the charge accumulation region.

Here, both the channel region and the charge accumulation region are constituted in the second conductive type, and the first conductive type of channel barrier region is disposed between the channel region and the charge accumulation region, so that carriers of the channel region and the charge accumulation region may be common and BCD may be realized without constituting a gate in an annular shape.

In a charge detection device and a charge detection method, a solid-state imaging device and a driving method thereof, and an imaging device according to the embodiments of the present invention, the high efficiency of conversion from signal charges into a voltage is possible since BCD may be constituted without constituting a gate in an annular shape and the reduction of a gate area may be realized.

DESCRIPTION OF THE PREFERRED EMBODIMENTS

Hereinafter, embodiments of the present invention will be described. A description will be provided in the following sequence.

1. First embodiment (CCD solid-state imaging device (area sensor))
2. Second embodiment (CCD solid-state imaging device (linear sensor))
3. Third embodiment (CMOS solid-state imaging device)
4. Fourth embodiment (imaging device)

<1. First Embodiment>

[Configuration of Solid-State Imaging Device]

Figure 1A:
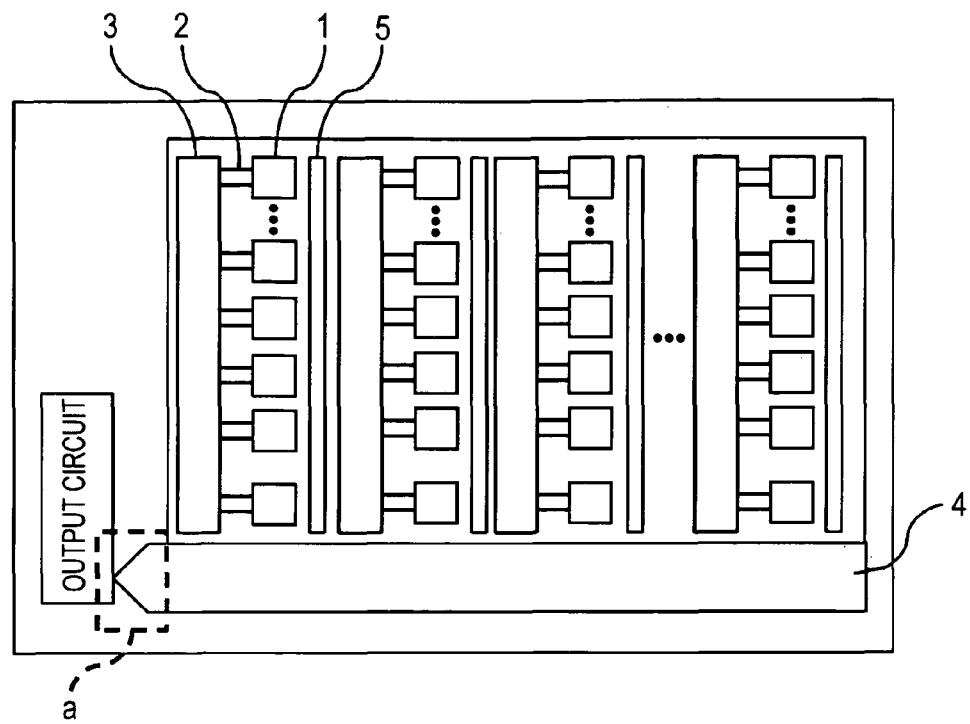
FIGS. 1A and 1B are schematic diagrams illustrating a CCD solid-state imaging device as an example of a solid-state imaging device according to an embodiment of the present invention.
Figure 1B:
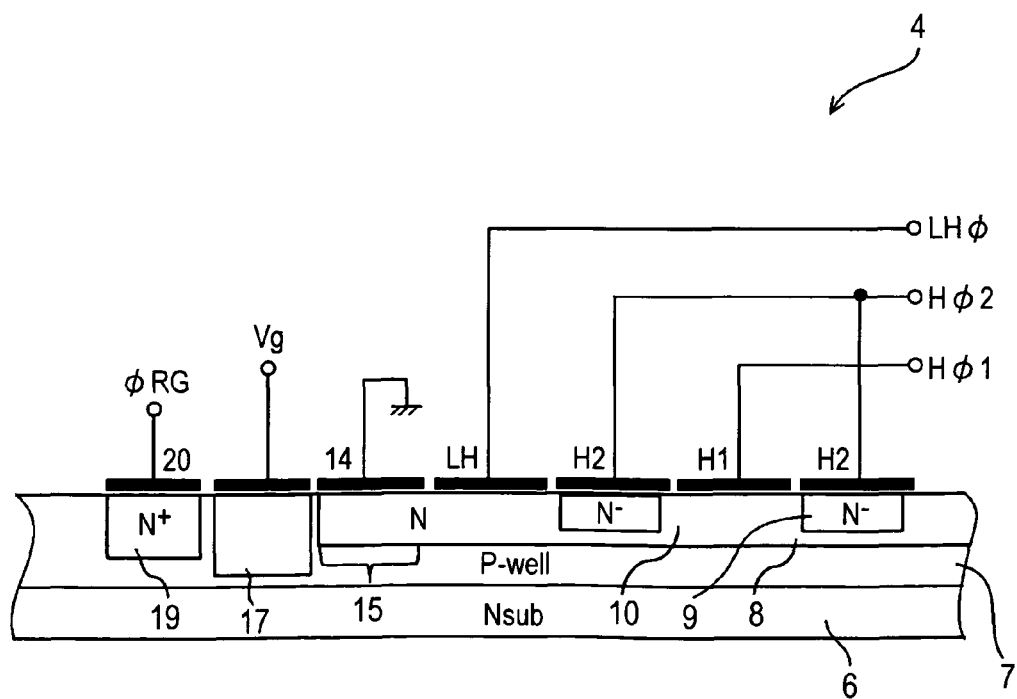

FIG. 1A is a schematic plan view illustrating a CCD solid-state imaging device (area sensor) as an example of a solid-state imaging device according to an embodiment of the present invention. FIG. 1B is a schematic cross-sectional view illustrating the last output stage (a region indicated by the symbol a in FIG. 1A) of a horizontal transfer register of the CCD solid-state imaging device (area sensor) as the example of the solid-state imaging device according to the embodiment of the present invention. Hereinafter, a charge detection device of a BCD configuration also serves as an example of a charge detection device according to an embodiment of the present invention.

Here, the CCD solid-state imaging device (area sensor) has a plurality of light receiving units 1 disposed in a matrix form within a silicon substrate and read gates 2 disposed adjacent to the light receiving units to read signal charges received by the light receiving units 1. The CCD solid-state imaging device has a vertical transfer register 3 disposed adjacent to the read gates 2 to transfer the signal charges read by the read gates 2 in a vertical direction, and a horizontal transfer register 4 which transfers the signal charges transferred by the vertical transfer register 3 in a horizontal direction. A channel stop region 5 is disposed to be opposite the read gates 2 of the light receiving units 1, and suppresses color mixture.

The horizontal transfer register 4 has a plurality of charge accumulation units which accumulates the signal charges obtained from the light receiving units 1. A configuration is made to change the potentials of the charge accumulation units and horizontally transfer the signal charges between the charge accumulation units by applying a transfer clock to a transfer electrode on the horizontal transfer register 4.

In the horizontal transfer register 4, an N-type channel region 8 is formed on the surface side of an N-type silicon substrate 6 via a P-type well 7. N$^-$-type transfer (TR) regions 9 are formed on a surface portion of the N-type channel region 8 at a constant pitch in a left and right direction of the figure and a channel region between the transfer regions 9 and 9 becomes a storage (ST) region 10.

An electrode H1 made of polysilicon of a first layer is formed above the storage region 10 and an electrode H2 made of polysilicon of a second layer is formed above the transfer region 9, respectively via an insulating film (not shown). The adjacent electrodes H1 and H2 form the pair, and the two-phase driven horizontal transfer is realized by alternately applying two-phase transfer clocks Hϕ1 and Hϕ2 to the electrode pair H1 and H2 in an arrangement direction thereof.

An HOG electrode 14 made of polysilicon of the second layer is formed at the last stage of the horizontal transfer register 4, and the HOG electrode 14 is electrically connected to a ground (earth) potential as a reference potential. Along with the underlying channel region, the HOG electrode 14 constitutes an output gate unit 15.

A BCD unit 17 is formed adjacent to the output gate unit 15, and an N$^+$-type reset drain (RD) unit 19 is formed at the side of the BCD unit 17. Above the reset drain unit 19, an electrode 20 made of polysilicon is formed via an insulating film (not shown).

That is, the charge detection device of the BCD configuration is realized by the BCD unit 17, the reset drain unit 19, and the electrode 20. Signal charges output from the output gate unit 15 are detected by the charge detection device of the BCD configuration.

Figure 2A:
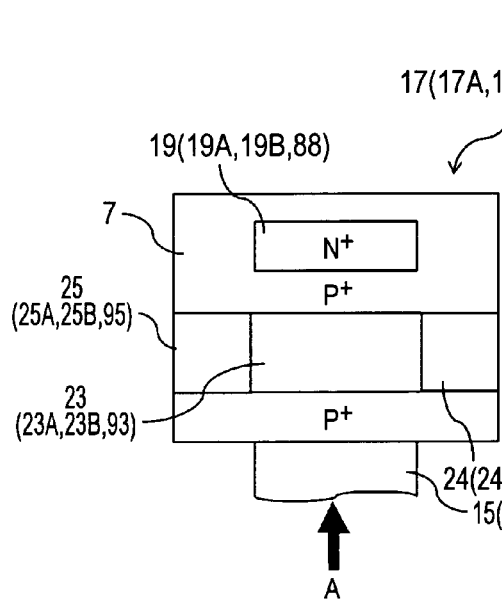
FIGS. 2A and 2B are schematic diagrams illustrating a BCD unit.
Figure 2B:
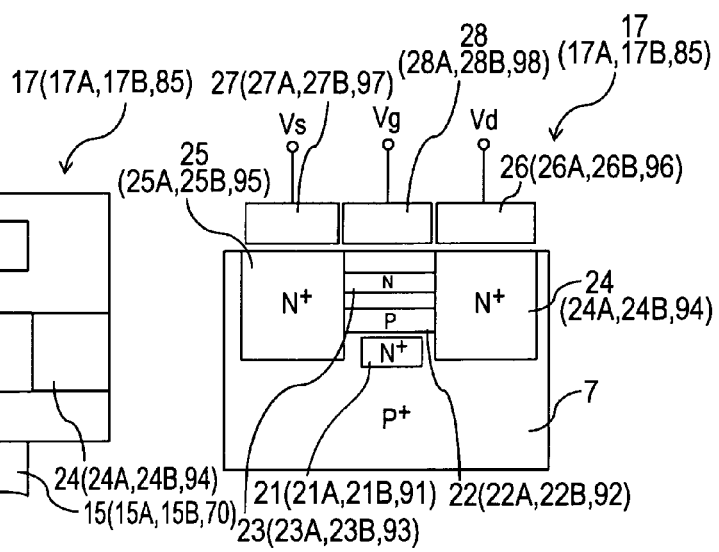

FIG. 2A is a schematic plan view illustrating the BCD unit 17, and FIG. 2B is a schematic cross-sectional view illustrating the BCD unit 17. The signal charges output from the output gate unit 15 are transferred in a direction indicated by the symbol A in the case of FIG. 2A, and are transferred from the front side to the backside of paper in FIG. 2B, so that the signal charges are input to the BCD unit 17.

The BCD unit 17 illustrated here has an N$^+$-type charge accumulation region 21 where the signal charges output from the output gate unit 15 are accumulated and a P-type channel barrier region 22 disposed in a region (a front side region of the silicon substrate) above the charge accumulation region 21. The BCD unit 17 has an N-type channel region 23 embedded in a P-type well 7 in a region (a front side region of the silicon substrate) above the P-type channel barrier region 22. An N$^+$-type drain region 24 and an N$^+$-type source region 25 are disposed to interpose the channel region 23.

An electrode 26 made of polysilicon is formed above the drain region 24, an electrode 27 made of polysilicon is formed above the source region 25, and an electrode 28 made of polysilicon is formed above the channel region 23, respectively via an insulating film (not shown). A constant voltage Vd is applied to the electrode 26 and a constant voltage Vg is applied to the electrode 28.

Here, a configuration is made to apply the constant voltage Vd to the electrode 26 and apply the constant voltage Vg to the electrode 28, so that a signal charge amount accumulated in the charge accumulation region 21 can be detected by an output signal (voltage value) from the electrode 27.

That is, when signal charges are accumulated in the charge accumulation region 21, a resistance value of the channel region 23 is changed and a threshold of a transistor having the drain region 24, the source region 25, and the electrode 28 functioning as the gate is changed. Therefore, a configuration is made to apply constant voltages to the electrode 26 and the electrode 28, so that a change of the threshold voltage of the transistor can be detected by a change of the voltage value of the electrode 27. In this way, the signal charge amount accumulated in the charge accumulation region 21 can be detected by the output signal (voltage value) from the electrode 27.

[Operation of Solid-State Imaging Device]

Hereinafter, the operation of the solid-state imaging device (area sensor) constituted as described above will be described. That is, an example of a method of driving the solid-state imaging device according to an embodiment of the present invention will be described. The operation of the charge detection device of the BCD configuration described above is an example of the charge detection method according to the embodiment of the present invention.

In the method of driving the solid-state imaging device (area sensor) according to the embodiment of the present invention, first, a vertical transfer clock is applied from a timing signal generating circuit (not shown) to the vertical transfer register 3.

By applying the vertical transfer clock, signal charges read from the light receiving unit 1 are transferred to the vertical transfer register 3 in the vertical direction. The signal charges vertically transferred by the vertical transfer register 3 are transferred to the horizontal transfer register 4.

Next, the signal charges transferred to the horizontal transfer register 4 are transferred in an output direction by applying transfer clocks to transfer electrodes H1, H2, and LH on the horizontal transfer register 4.

Figure 3:
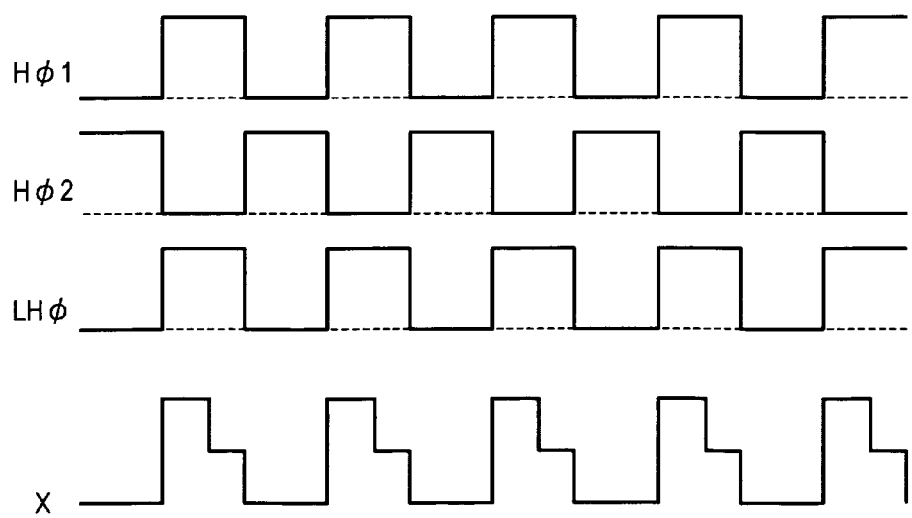
FIG. 3 is a timing chart of various clock pulses.

Specifically, a transfer clock indicated by the symbol Hϕ1 in FIG. 3 is applied to the transfer electrode indicated by the symbol H1 in FIG. 1B, a transfer clock indicated by the symbol Hϕ2 in FIG. 3 is applied to the transfer electrode indicated by the symbol H2 in FIG. 1B, and a transfer clock indicated by the symbol LHϕ in FIG. 3 is applied to the transfer electrode indicated by the symbol LH in FIG. 1B. The signal charges are transferred in the output direction (in a direction from the right to the left in the case of FIG. 1A) by applying the transfer clocks and increasing/decreasing a potential of the charge accumulation unit of the horizontal transfer register 4.

In the first embodiment, "Amplitude of Hϕ1/Amplitude of Hϕ2" is about 3 to 5 V, Hϕ1 and Hϕ2 are opposite in phase to each other, and Hϕ1 and LHϕ are the same transfer clock.

Continuously, signal charges transferred through the horizontal transfer register 4 are transferred to the charge accumulation region 21, and an amount of signal charges transferred to the charge accumulation region 21 is detected as the voltage value of the electrode 27.

The signal charges accumulated in the charge accumulation region 21 are swept into the reset drain unit 19 by applying a reset pulse ϕRG to the electrode 20 after detecting the signal charge amount by the electrode 27.

An output signal of the CCD solid-state imaging device (area sensor) as indicated by the symbol X in FIG. 3 can be obtained by performing the series of operations.

In the solid-state imaging device according to the embodiment of the present invention, the charge accumulation region 21 is constituted in the N$^+$ type and the channel region 23 is constituted in the N type, so that all carriers of the two regions are electrons. Therefore, a gate area of the charge detection device can be reduced without constituting the electrode 28 functioning as the gate in the annular shape. The efficiency of conversion from signal charges into a voltage is increased with the reduction of the gate area of the charge detection device.

The solid-state imaging device according to the embodiment of the present invention is constituted to sweep signal charges into the reset drain unit 19 different from the drain region 24 after detecting the signal charge amount accumulated in the charge accumulation region 21. Therefore, power consumption can also be reduced.

That is, a current flows between the source and the drain in a sweep operation after detecting the signal charge amount since a signal charge sweep region is in common with the drain region of the transistor which detects the signal charge amount in the charge detection device of the BCD configuration of the related art. On the other hand, no current flows between the source and the drain in the sweep operation after detecting the signal charge amount since the drain region 24 and the reset drain unit 19 are separately disposed in the charge detection device of the solid-state imaging device according to the embodiment of the present invention. Therefore, power consumption can be reduced as described above.

There is an advantage when the charge detection device is manufactured since the drain region 24 and the reset drain unit 19 can be separately disposed and the drain region 24 and the reset drain unit 19 can be independently manufactured.

That is, the drain region 24 and the reset drain region 19 can be simultaneously manufactured, or the drain region 24 and the reset drain region 19 can be separately manufactured, when the charge detection device is manufactured. Therefore, a formation method can be selected in response to a situation at the time of manufacturing the charge detection device, and there is an advantage when the charge detection device is manufactured as described above.

The reduction of random telegraph signal noise (RTS noise) considered as a factor of voltage drop in a silicon substrate interface can be promoted since there is adopted a configuration in which the channel region 23 is embedded in the P-type well 7.

MODIFIED EXAMPLE 1

In the first embodiment, an example in which the N+-type charge accumulation region 21, the P-type channel barrier region 22, the N-type channel region 23, the N+-type drain region 24, and the N+-type source region 25 are disposed in the P-type well 7 has been described. That is, an example in which all carriers of the charge accumulation region 21 and the channel region 23 are electrons has been described. However, it is desirable for the carriers of the charge accumulation region 21 and the channel region 23 to be common, the carriers are not necessary to be electrons, and the carriers may be holes.

MODIFIED EXAMPLE 2

In the first embodiment, an example in which the channel region 23 is constituted to be embedded in the P-type well 7 has been described. However, it is enough if the carriers of the channel region 23 are in common with those of the charge accumulation region 21, and thus the channel region 23 is not necessary to be embedded in the P-type well 7. In this regard, it is desirable to constitute the channel region 23 to be embedded in the P-type well 7 in consideration of RTS noise reduction since RTS noise can be reduced by embedding the channel region 23 in the P-type well 7 as described above.

[2. Second Embodiment]
[Configuration of Solid-State Imaging Device]

Figure 4A:
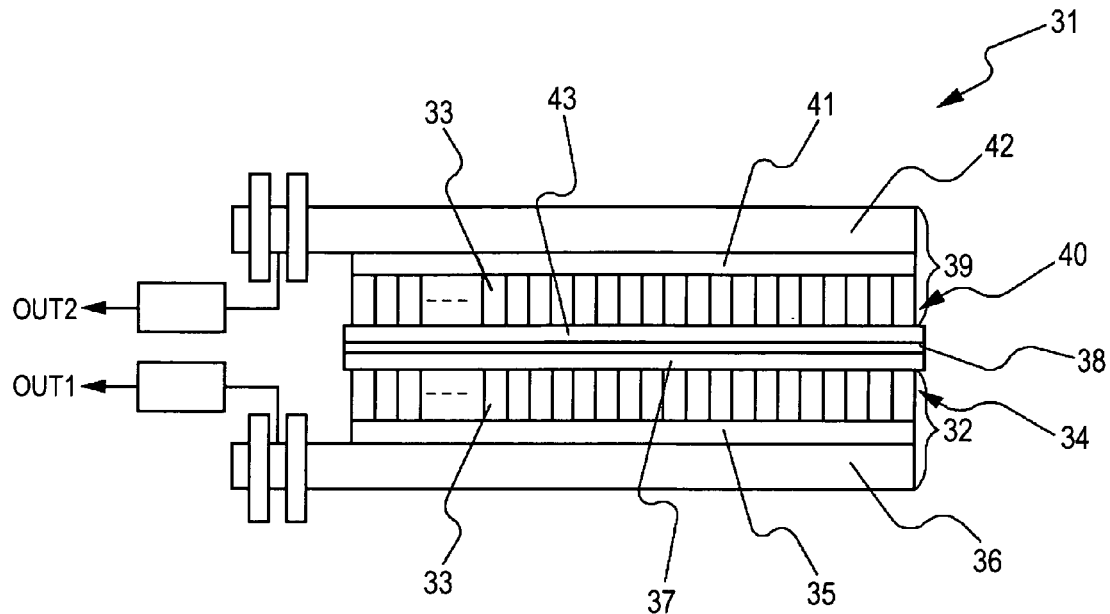
FIGS. 4A and 4B are schematic diagrams illustrating a CCD solid-state imaging device as another example of the solid-state imaging device according to the embodiment of the present invention.
Figure 4B:
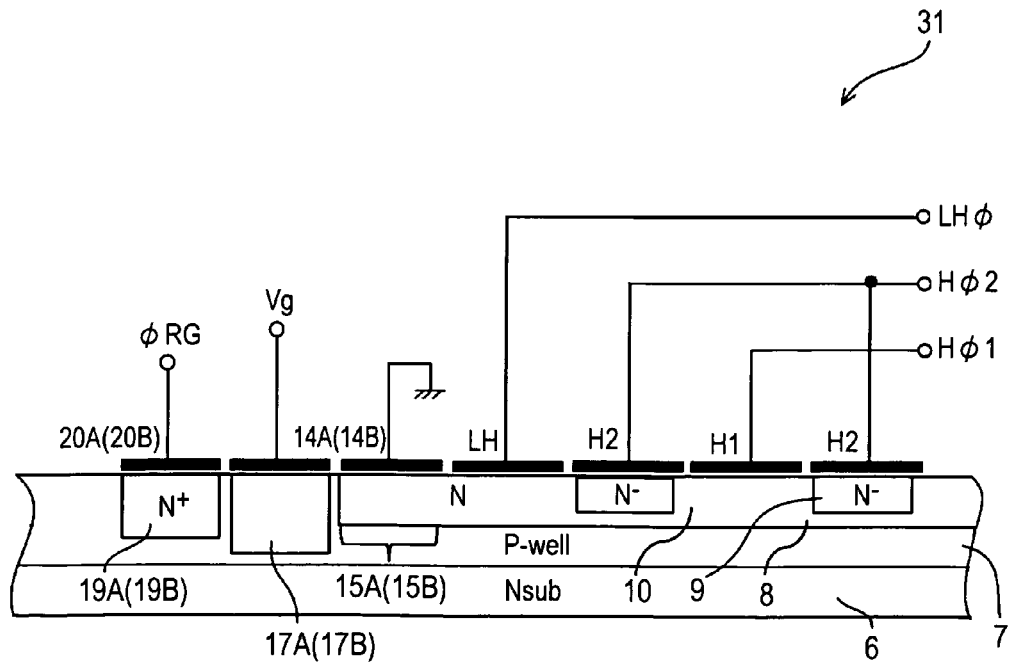

FIG. 4A is a schematic plan view illustrating a CCD solid-state imaging device (linear sensor) as another example of the solid-state imaging device according to the embodiment of the present invention. FIG. 4B is a schematic cross-sectional view illustrating the last output stage of a transfer register of the CCD solid-state imaging device (linear sensor) as the second example of the solid-state imaging device according to the embodiment of the present invention. Hereinafter, a charge detection device of the BCD configuration also serves as an example of a charge detection device according to an embodiment of the present invention.

A first CCD linear sensor 32 of a CCD solid-state imaging device (linear sensor) 31 illustrated here has a first sensor array 34 in which a plurality of photoelectric conversion units (light receiving units) 33 having photodiodes is linearly disposed. A first read gate 35 which reads photoelectrically converted signal charges from each light receiving unit and a first transfer register 36 which transfers the signal charges read by the first read gate 35 to an output unit are disposed at one side of the first sensor array 34. A first overflow control barrier 37 and a first overflow drain 38 are constituted to be disposed at the other side of the first sensor array 34.

As illustrated in FIG. 4B, the first transfer register has a plurality of charge accumulation units which accumulates signal charges obtained from the light receiving units 33. A configuration is made to change the potentials of the charge accumulation units and transfer the signal charges between the charge accumulation units by applying a transfer clock to a transfer electrode on the first transfer register 36.

In the first transfer register 36, an N-type channel region 8 is formed on the surface side of an N-type silicon substrate 6 via a P-type well 7. N−-type transfer (TR) regions 9 are formed on a surface portion of the N-type channel region 8 at a constant pitch in a left and right direction of the figure and a channel region between the transfer regions 9 and 9 becomes a storage (ST) region 10.

An electrode H1 made of polysilicon of a first layer is formed above the storage region 10 and an electrode H2 made of polysilicon of a second layer is formed above the transfer region 9, respectively via an insulating film (not shown). The adjacent electrodes H1 and H2 form the pair, and the two-phase driven horizontal transfer is realized by alternately applying two-phase transfer clocks H$\phi$1 and H$\phi$2 to the electrode pair H1 and H2 in an arrangement direction thereof.

An HOG electrode 14A made of polysilicon of the second layer is formed at the last stage of the first transfer register 36, and the HOG electrode 14A is electrically connected to a ground (earth) potential as a reference potential. Along with the underlying channel region, the HOG electrode 14A constitutes an output gate unit 15A.

A BCD unit 17A is formed adjacent to the output gate unit 15A and an N+-type reset drain (RD) unit 19A is formed at the side of the BCD unit 17A. Above the reset drain unit 19A, an electrode 20A made of polysilicon is formed via an insulating film (not shown).

That is, the charge detection device of the BCD configuration is realized by the BCD unit 17A, the reset drain unit 19A, and the electrode 20A. Signal charges output from the output gate unit 15A are detected by the charge detection device of the BCD configuration.

Here, the BCD unit 17A has an N+-type charge accumulation region 21A where signal charges output from the output gate unit 15A are accumulated and a P-type channel barrier region 22A disposed in a region (a front side region of the silicon substrate) above the charge accumulation region 21A. The BCD unit 17A has an N-type channel region 23A embedded in a P-type well 7 in a region (a front side region of the silicon substrate) above the P-type channel barrier region 22A. An N+-type drain region 24A and an N+-type source region 25A are disposed to interpose the channel region 23A (see FIGS. 2A and 2B).

An electrode 26A made of polysilicon is formed above the drain region 24A and an electrode 27A made of polysilicon is formed above the source region 25A, respectively via an insulating film (not shown). An electrode 28A made of polysilicon is formed above the channel region 23A via an insulating film (not shown). A constant voltage Vd is applied to the electrode 26A and a constant voltage Vg is applied to the electrode 28A.

Here, a configuration is made to apply the constant voltage Vd to the electrode 26A and apply the constant voltage Vg to the electrode 28A, so that a signal charge amount accumulated in the charge accumulation region 21A can be detected by an output signal (voltage value) from the electrode 27A.

That is, when signal charges are accumulated in the charge accumulation region 21A, a resistance value of the channel region 23A is changed and a threshold voltage of a transistor having the drain region 24A, the source region 25A, and the electrode 28A functioning as the gate is changed. Therefore, a configuration is made to apply constant voltages to the electrode 26A and the electrode 28A, so that a change of the threshold voltage of the transistor can be detected by a change of the voltage value of the electrode 27A. In this way, the signal charge amount accumulated in the charge accumulation region 21A can be detected by the output signal (voltage value) from the electrode 27A.

Like the first CCD linear sensor 32, a second CCD linear sensor 39 of the CCD solid-state imaging device (linear sensor) 31 has a second sensor array 40 in which a plurality of photoelectric conversion units (light receiving units) having photodiodes is linearly disposed. A second read gate 41 which reads photoelectrically converted signal charges from each light receiving unit and a second transfer register 42 which transfers the signal charges read by the second read gate 41 to an output unit are disposed at one side of the second sensor array 40. A second overflow control barrier 43 and a second overflow drain 38 are constituted to be disposed at the other side of the second sensor array 40.

As illustrated in FIG. 4B, the second transfer register has a plurality of charge accumulation units which accumulates signal charges obtained from the light receiving units 33. A configuration is made to change the potentials of the charge accumulation units and transfer the signal charges between the charge accumulation units by applying a transfer clock to a transfer electrode on the second transfer register 42.

In the second transfer register 42, an N-type channel region 8 is formed on the surface side of an N-type silicon substrate 6 via a P-type well 7. N$^-$-type transfer (TR) regions 9 are formed on a surface portion of the N-type channel region 8 at a constant pitch in a left and right direction of the figure and a channel region between the transfer regions 9 and 9 becomes a storage (ST) region 10.

An electrode H1 made of polysilicon of a first layer is formed above the storage region 10 and an electrode H2 made of polysilicon of a second layer is formed above the transfer region 9, respectively via an insulating film (not shown). The adjacent electrodes H1 and H2 form the pair, and the two-phase driven horizontal transfer is realized by alternately applying two-phase transfer clocks H$\phi$1 and H$\phi$2 to the electrode pair H1 and H2 in an arrangement direction thereof.

An HOG electrode 14B made of polysilicon of the second layer is formed at the last stage of the second transfer register 42, and the HOG electrode 14B is electrically connected to a ground (earth) potential as a reference potential. Along with the underlying channel region, the HOG electrode 14B constitutes an output gate unit 15B.

A BCD unit 17B is formed adjacent to the output gate unit 15B and an N$^+$-type reset drain (RD) unit 19B is formed at the side of the BCD unit 17B. Above the reset drain unit 19B, an electrode 20B made of polysilicon is formed via an insulating film (not shown).

That is, the charge detection device of the BCD configuration is realized by the BCD unit 17B, the reset drain unit 19B, and the electrode 20B. Signal charges output from the output gate unit 15B are detected by the charge detection device of the BCD configuration.

Here, the BCD unit 17B has an N$^+$-type charge accumulation region 21B where signal charges output from the output gate unit 15B are accumulated and a P-type channel barrier region 22B disposed in a region (a front side region of the silicon substrate) above the charge accumulation region 21B. The BCD unit 17B has an N-type channel region 23B embedded in a P-type well 7 in a region (a front side region of the silicon substrate) above the P-type channel barrier region 22B. An N$^+$-type drain region 24B and an N$^+$-type source region 25B are disposed to interpose the channel region 23B (see FIGS. 2A and 2B).

An electrode 26B made of polysilicon is formed above the drain region 24B and an electrode 27B made of polysilicon is formed above the source region 25B, respectively via an insulating film (not shown). An electrode 28B made of polysilicon is formed above the channel region 23B via an insulating film (not shown). A constant voltage Vd is applied to the electrode 26B and a constant voltage Vg is applied to the electrode 28B.

Here, a configuration is made to apply the constant voltage Vd to the electrode 26B and apply the constant voltage Vg to the electrode 28B, so that a signal charge amount accumulated in the charge accumulation region 21B can be detected by an output signal (voltage value) from the electrode 27B.

That is, when signal charges are accumulated in the charge accumulation region 21B, a resistance value of the channel region 23B is changed and a threshold voltage of a transistor having the drain region 24B, the source region 25B, and the electrode 28B functioning as the gate is changed. Therefore, a configuration is made to apply constant voltages to the electrode 26B and the electrode 28B, so that a change of the threshold voltage of the transistor can be detected by a change of the voltage value of the electrode 27B. In this way, the signal charge amount accumulated in the charge accumulation region 21B can be detected by the output signal (voltage value) from the electrode 27B.

[Operation of Solid-State Imaging Device]

Hereinafter, the operation of the solid-state imaging device (linear sensor) constituted as described above will be described. That is, another example of the method of driving the solid-state imaging device according to the embodiment of the present invention will be described. The operation of the charge detection device of the BCD configuration described above is an example of the charge detection method according to the embodiment of the present invention.

In the first CCD linear sensor 32 of the solid-state imaging device (linear sensor) according to the embodiment of the present invention, first, signal charges accumulated in each light receiving unit of the first sensor array 34 are read out to the first transfer register 36 via the first read gate 35 in response to incident light.

Next, the signal charges transferred to the first transfer register 36 are transferred in an output direction by applying transfer clocks to transfer electrodes H1, H2, and LH on the first transfer register 36.

Specifically, the transfer clock indicated by the symbol H$\phi$1 in FIG. 3 is applied to a transfer electrode indicated by the symbol H1 in FIG. 4B, the transfer clock indicated by the symbol H$\phi$2 in FIG. 3 is applied to a transfer electrode indicated by the symbol H2 in FIG. 4B, and the transfer clock indicated by the symbol LH$\phi$ in FIG. 3 is applied to a transfer electrode indicated by the symbol LH in FIG. 4B. The signal charges are transferred in the output direction (in a direction from the right to the left in the case of FIG. 4A) by applying the transfer clocks and increasing/decreasing a potential of the charge accumulation unit of the first transfer register 36.

Continuously, signal charges transferred through the first transfer register 36 are transferred to the charge accumulation region 21A, and an amount of signal charges transferred to the charge accumulation region 21A is detected as the voltage value of the electrode 27A.

The signal charges accumulated in the charge accumulation region 21A are swept into the reset drain unit 19A by applying a reset pulse φRG to the electrode 20A after detecting the signal charge amount by the electrode 27A.

An output signal can be obtained from the first CCD linear sensor 32 by performing the series of operations.

In the second CCD linear sensor 39 of the solid-state imaging device (linear sensor) according to the embodiment of the present invention, first, signal charges accumulated in each light receiving unit of the second sensor array 40 are read and output to the second transfer register 42 via the second read gate 41 in response to incident light.

Next, the signal charges transferred to the second transfer register 42 are transferred in an output direction by applying transfer clocks to transfer electrodes H1, H2, and LH on the second transfer register 42.

Specifically, the transfer clock indicated by the symbol Hφ1 in FIG. 3 is applied to the transfer electrode indicated by the symbol H1 in FIG. 4B, the transfer clock indicated by the symbol Hφ2 in FIG. 3 is applied to the transfer electrode indicated by the symbol H2 in FIG. 4B, and the transfer clock indicated by the symbol LHφ in FIG. 3 is applied to the transfer electrode indicated by the symbol LH in FIG. 4B. The signal charges are transferred in the output direction (in a direction from the right to the left in the case of FIG. 4A) by applying the transfer clocks and increasing/decreasing a potential of the charge accumulation unit of the second transfer register 42.

Continuously, signal charges transferred through the second transfer register 42 are transferred to the charge accumulation region 21B, and an amount of signal charges transferred to the charge accumulation region 21B is detected as the voltage value of the electrode 27B.

The signal charges accumulated in the charge accumulation region 21B are swept into the reset drain unit 19B by applying a reset pulse φRG to the electrode 20B after detecting the signal charge amount by the electrode 27B.

An output signal can be obtained from the second CCD linear sensor 39 by performing the series of operations.

The charge accumulation region 21A is constituted in the N⁺ type and the channel region 23A is constituted in the N type, so that all carriers of the two regions are electrons in the first CCD linear sensor 32 of the solid-state imaging device according to the embodiment of the present invention. Therefore, a gate area of the charge detection device can be reduced without constituting the electrode 28A functioning as the gate in the annular shape. The efficiency of conversion from signal charges into a voltage is increased with the reduction of the gate area of the charge detection device.

Likewise, the charge accumulation region 21B is constituted in the N⁺ type and the channel region 23B is constituted in the N type, so that all carriers of the two regions are electrons in the second CCD linear sensor 39 of the solid-state imaging device according to the embodiment of the present invention. Therefore, a gate area of the charge detection device can be reduced without constituting the electrode 28B functioning as the gate in the annular shape. The efficiency of conversion from signal charges into a voltage is increased with the reduction of the gate area of the charge detection device.

The first CCD linear sensor 32 of the solid-state imaging device according to the embodiment of the present invention is constituted to sweep signal charges into the reset drain unit 19A different from the drain region 24A after detecting the signal charge amount accumulated in the charge accumulation region 21A. Therefore, power consumption can also be reduced.

That is, a current flows between the source and the drain in a sweep operation after detecting the signal charge amount since a signal charge sweep region is in common with the drain region of the transistor which detects the signal charge amount in the charge detection device of the BCD configuration of the related art. On the other hand, the drain region 24A and the reset drain unit 19A are separately disposed in the charge detection device of the first CCD linear sensor 32 in the solid-state imaging device according to the embodiment of the present invention. Therefore, no current flows between the source and the drain in the sweep operation after detecting the signal charge amount, and power consumption can be reduced as described above.

Likewise, the second CCD linear sensor 39 of the solid-state imaging device according to the embodiment of the present invention is constituted to sweep signal charges into the reset drain unit 19B different from the drain region 24B after detecting the signal charge amount accumulated in the charge accumulation region 21B. Therefore, power consumption can also be reduced.

That is, a current flows between the source and the drain in a sweep operation after detecting the signal charge amount since a signal charge sweep region is in common with the drain region of the transistor which detects the signal charge amount in the charge detection device of the BCD configuration of the related art. On the other hand, the drain region 24B and the reset drain unit 19B are separately disposed in the charge detection device of the second CCD linear sensor 39 in the solid-state imaging device according to the embodiment of the present invention. Therefore, no current flows between the source and the drain in the sweep operation after detecting the signal charge amount, and power consumption can be reduced as described above.

There is an advantage when the charge detection device is manufactured since the drain region 24A and the reset drain unit 19A can be separately disposed and the two can be independently manufactured in the first CCD linear sensor 32 of the solid-state imaging device according to the embodiment of the present invention.

That is, the drain region 24A and the reset drain region 19A can be simultaneously manufactured, or the drain region 24A and the reset drain region 19A can be separately manufactured, when the charge detection device is manufactured. Therefore, a formation method can be selected in response to a situation at the time of manufacturing the charge detection device, and there is an advantage when the charge detection device is manufactured as described above.

Likewise, there is an advantage when the charge detection device is manufactured since the drain region 24B and the reset drain unit 19B can be separately disposed and the two can be independently manufactured in the second linear sensor 39 of the solid-state imaging device according to the embodiment of the present invention.

That is, the drain region 24B and the reset drain region 19B can be simultaneously manufactured, or the drain region 24B and the reset drain region 19B can be separately manufactured, when the charge detection device is manufactured. Therefore, a formation method can be selected in response to a situation at the time of manufacturing the charge detection device, and there is an advantage when the charge detection device is manufactured as described above.

The first CCD linear sensor 32 of the solid-state imaging device according to the embodiment of the present invention adopts a configuration in which the channel region 23A is embedded in the P-type well 7. Therefore, the reduction of random telegraph signal noise (RTS noise) considered as a factor of voltage drop in a silicon substrate interface can be promoted.

Likewise, the second CCD linear sensor 39 of the solid-state imaging device according to the embodiment of the present invention adopts a configuration in which the channel region 23B is embedded in the P-type well 7. Therefore, the reduction of random telegraph signal noise (RTS noise) considered as a factor of voltage drop in a silicon substrate interface can be promoted.

MODIFIED EXAMPLE 1

In the second embodiment, an example in which the $N^+$-type charge accumulation region 21A, the P-type channel barrier region 22A, the N-type channel region 23A, the $N^+$-type drain region 24A, and the $N^+$-type source region 25A are disposed in the P-type well 7 has been described. That is, an example in which all carriers of the charge accumulation region 21A and the channel region 23A of the first CCD linear sensor 32 are electrons has been described. However, it is desirable for the carriers of the charge accumulation region 21A and the channel region 23A to be common, the carriers are not necessary to be electrons, and the carriers may be holes.

Likewise, in the second embodiment, an example in which the $N^+$-type charge accumulation region 21B, the P-type channel barrier region 22B, the N-type channel region 23B, the $N^+$-type drain region 24B, and the $N^+$-type source region 25B are disposed in the P-type well 7 has been described. That is, an example in which all carriers of the charge accumulation region 21B and the channel region 23B of the second CCD linear sensor 39 are electrons has been described. However, it is desirable for the carriers of the charge accumulation region 21B and the channel region 23B to be common, the carriers are not necessary to be electrons, and the carriers may be holes.

MODIFIED EXAMPLE 2

In the second embodiment, an example in which the channel region 23A or 23B is constituted to be embedded in the P-type well 7 has been described. However, it is enough if the carriers of the channel region 23A or 23B are in common with those of the charge accumulation region 21A or 21B, and thus the channel region 23A or 23B is not necessary to be embedded in the P-type well 7. In this regard, it is desirable to constitute the channel region 23A or 23B to be embedded in the P-type well 7 in consideration of RTS noise reduction since RTS noise can be reduced by embedding the channel region 23A or 23B in the P-type well 7 as described above.

<3. Third Embodiment>

[Configuration of Solid-State Imaging Device]

Figure 5:
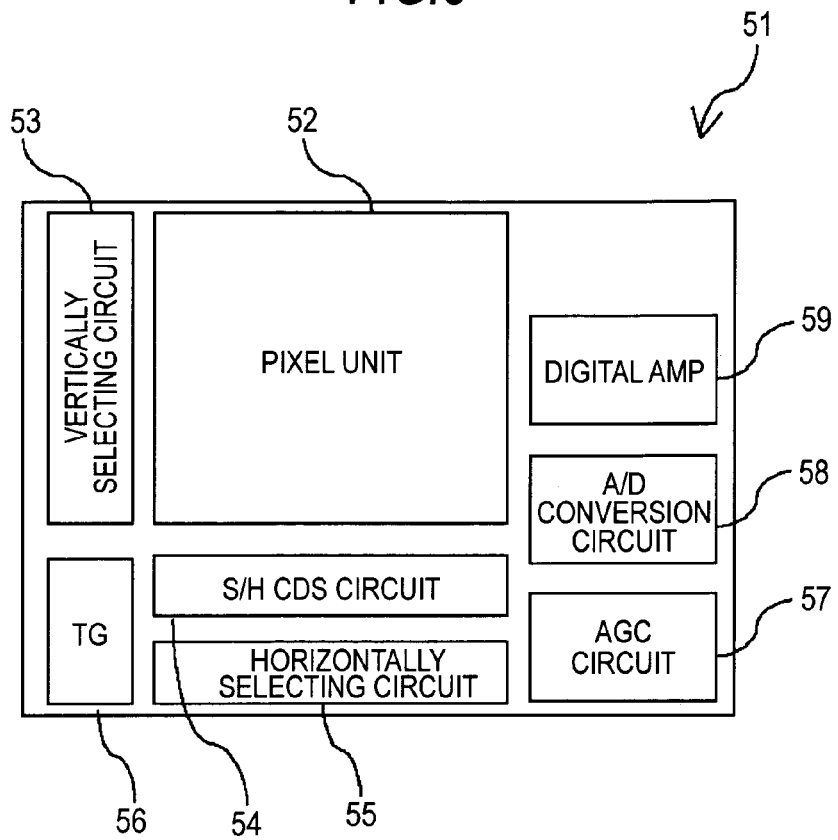
FIG. 5 is a schematic configuration diagram illustrating a backside-illuminated CMOS solid-state imaging device as a further example of the solid-state imaging device according to the embodiment of the present invention.

FIG. 5 is a schematic configuration diagram illustrating a backside-illuminated CMOS solid-state imaging device as a further example of the solid-state imaging device according to the embodiment of the present invention. A solid-state image device 51 illustrated here has a pixel unit 52 and a peripheral circuit unit. These are constituted to be mounted on the same silicon substrate. In the third embodiment, the peripheral circuit unit includes a vertically selecting circuit 53, a sample hold correlated double sampling (S/H CDS) circuit 54, a horizontally selecting circuit 55, and a timing generator (TG) 56. The peripheral circuit unit further includes an AGC circuit 57, an A/D conversion circuit 58, and a digital amplifier 59.

In the pixel unit 52, a plurality of unit pixels to be described later is disposed in a matrix shape, an address line or the like is disposed in a row unit, and a signal line or the like is disposed in a column unit.

The vertically selecting circuit 53 selects pixels in the row unit and enables each pixel signal to be read and output to the S/H CDS circuit 54 through a vertical signal line. The S/H CDS circuit 54 performs a signal process such as CDS (Correlated Double Sampling) or the like for a pixel signal read from each pixel column.

The horizontally selecting circuit 55 sequentially extracts pixel signals held in the S/H CDS circuit 54, and outputs the extracted pixel signals to the AGC (Automatic Gain Control) circuit 57. The AGC circuit 57 amplifies a signal input from the horizontally selecting circuit 55 by a proper gain and outputs the amplified signal to the A/D conversion circuit 58.

The A/D conversion circuit 58 converts an analog signal input from the AGC circuit 57 into a digital signal and outputs the digital signal to the digital amplifier 59. The digital amplifier 59 properly amplifies the digital signal input from the A/D conversion circuit 58, and outputs the amplified signal from a pad (port).

The operations of the vertically selecting circuit 53, the S/H CDS circuit 54, the horizontally selecting circuit 55, the AGC circuit 57, the A/D conversion circuit 58, and the digital amplifier 59 are performed on the basis of various timing signals output from the timing generator 56.

Figure 6:
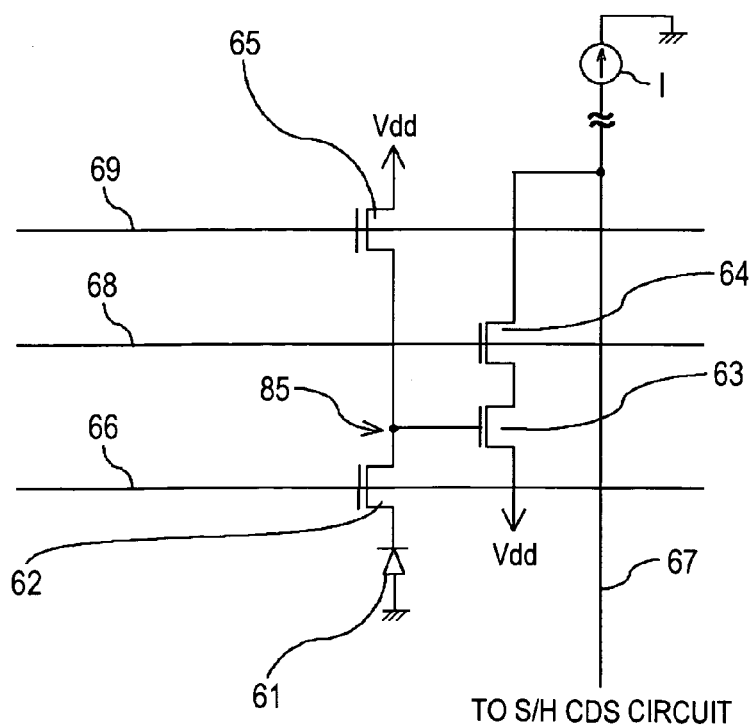
FIG. 6 is a schematic diagram illustrating an example of the circuit configuration of a unit pixel of a pixel unit.

FIG. 6 is a schematic diagram illustrating an example of the circuit configuration of a unit pixel of the pixel unit 52. The unit pixel has, for example, a photodiode 61 as a photoelectric conversion element, and has four transistors of a transfer transistor 62, an amplification transistor 63, an address transistor 64, and a reset transistor 65 as active elements for one photodiode 61.

The photodiode 61 photoelectrically converts incident light into an amount of charges (here, electrons) corresponding to a light amount thereof. The transfer transistor 62 is connected between the photodiode 61 and a BCD unit 85. The electrons photoelectrically converted by the photodiode 61 are transferred to the BCD unit 85 by applying a drive signal to a gate (transfer gate) of the transfer transistor 62 through a driving wiring 66.

A gate of the amplification transistor 63 is connected to the BCD unit 85. The amplification transistor 63 connected to a vertical signal line 67 via the address transistor 64 constitutes a source follower with a constant current source I outside the pixel unit. When an address signal is supplied to a gate of the address transistor 64 through a driving wiring 68 and the address transistor 64 is turned on, the amplification transistor 63 amplifies a potential detected by the BCD unit 85, and outputs a voltage corresponding to the amplified potential to the vertical signal line 67. A voltage output from each pixel is output to the S/H CDS circuit 54 through the vertical signal line 67.

The reset transistor 65 is connected between a power supply voltage Vdd and the BCD unit 85. The signal charges of the BCD unit 85 are reset by applying a reset signal to a gate of the reset transistor 65 through the driving wiring 69. These operations are simultaneously performed for pixels of one row since the gates of the transfer transistor 62, the address transistor 64, and the reset transistor 65 are connected in the row unit.

Figure 7:
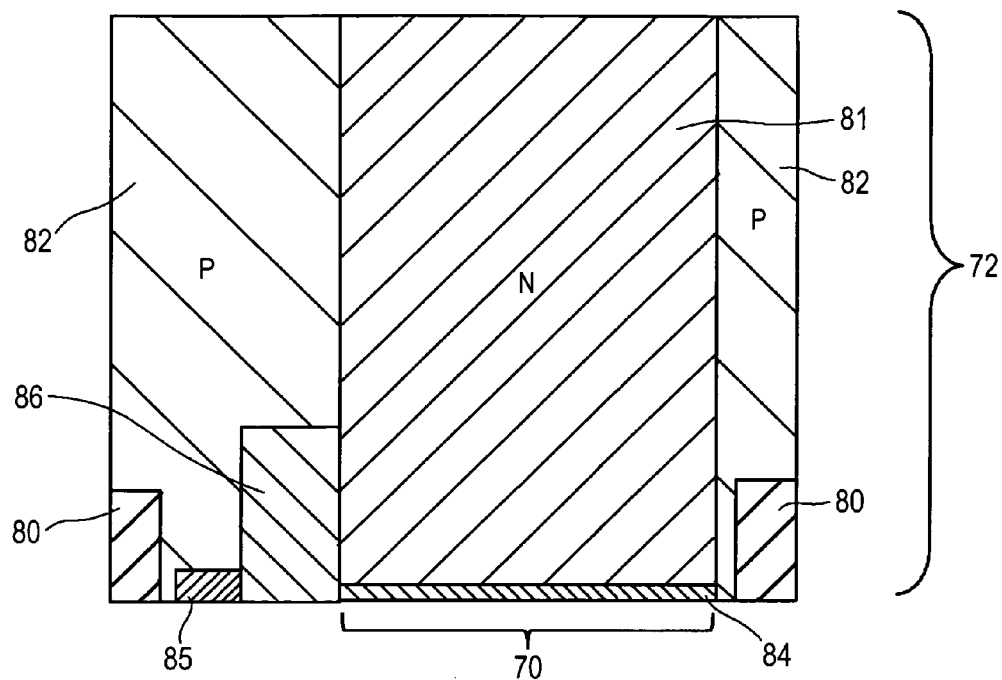
FIG. 7 is a cross-sectional view illustrating main elements of a pixel unit of a backside-illuminated CMOS solid-state imaging device as a still further example of the solid-state imaging device according to the embodiment of the present invention.

FIG. 7 is a cross-sectional view illustrating main elements of a pixel unit of a backside-illuminated CMOS solid-state imaging device as a still further example of the solid-state imaging device according to the embodiment of the present invention.

In a region of a light receiving unit 70 of the pixel unit illustrated here, an N-type charge accumulation region 81 is formed in a silicon substrate 72. To move the signal charge accumulation region toward the front side of the silicon substrate 72 (the lower side of FIG. 7), the charge accumulation region 81 may be formed so that an impurity concentration increases toward the front side of the silicon substrate 72. To efficiently receive incident light, the charge accumulation region 81 may be formed so that an area increases toward the backside of the silicon substrate 72 (the upper side of FIG. 7).

In the silicon substrate 72, a P-type well 82 is formed around the charge accumulation region 81. A shallow P-type hole accumulation region 84 is formed in a region of the light receiving unit 70 on the front side of the silicon substrate 72.

An element separation insulating film 80 made of oxide silicon is formed on the front side of the silicon substrate 72. A BCD unit 85 is formed on the front side of the silicon substrate 72. A P-type region 86 is formed between the BCD unit 85 and the charge accumulation region 81 to be electrically separated.

An $N^+$-type reset drain (RD) unit 88 is formed at the side of the BCD unit 85. An electrode (not shown) made of polysilicon is formed above the reset drain unit 88 via an insulating film (not shown).

That is, the charge detection device of the BCD configuration is realized by the BCD unit 85, the reset drain unit 88, and the electrode. Signal charges accumulated by the light receiving unit 70 are detected by the charge detection device of the BCD configuration.

The BCD unit 85 will be described using FIGS. 2A and 2B. In FIGS. 2A and 2B, the front side is illustrated in an upper portion and the backside is illustrated in a lower portion. The front side and the backside in FIGS. 2A and 2B are reversed from those in FIG. 7.

As illustrated in FIGS. 2A and 2B, the BCD unit 85 has an $N^+$-type charge accumulation region 91 where signal charges transferred from the light receiving unit 70 are accumulated and a P-type channel barrier region 92 disposed in a region (a front side region of the silicon substrate) above the charge accumulation region 91. The BCD unit 85 has an N-type channel region 93 embedded in a P-type well 7 in a region (a front side region of the silicon substrate) above the P-type channel barrier region 92. An $N^+$-type drain region 94 and an $N^+$-type source region 95 are disposed to interpose the channel region 93.

An electrode 96 made of polysilicon is formed above the drain region 94, an electrode 97 made of polysilicon is formed above the source region 95, and an electrode 98 made of polysilicon is formed above the channel region 93, respectively via an insulating film (not shown). A constant voltage Vd is applied to the electrode 96 and a constant voltage Vg is applied to the electrode 98.

Here, a configuration is made to apply the constant voltage Vd to the electrode 96 and apply the constant voltage Vg to the electrode 98, so that a signal charge amount accumulated in the charge accumulation region 91 can be detected by an output signal (voltage value) from the electrode 97.

That is, when signal charges are accumulated in the charge accumulation region 91, a resistance value of the channel region 93 is changed and a threshold voltage of a transistor having the drain region 94, the source region 95, and the electrode 98 functioning as the gate is changed. Therefore, a configuration is made to apply constant voltages to the electrode 96 and the electrode 98, so that a change of the threshold voltage of the transistor can be detected by a change of the voltage value of the electrode 97. In this way, the signal charge amount accumulated in the charge accumulation region 91 can be detected by the output signal (voltage value) from the electrode 97.

[Operation of Solid-State Imaging Device]

Hereinafter, the operation of the solid-state imaging device constituted as described above will be described. That is, a further example of the method of driving the solid-state imaging device according to the embodiment of the present invention will be described. The operation of the charge detection device of the BCD described above is an example of a charge detection method according to an embodiment of the present invention.

In the further example of the method of driving the solid-state imaging device according to the embodiment of the present invention, first, the light receiving unit 70 photoelectrically converts incident light from the backside of the silicon substrate 72 and generates signal charges corresponding to an amount of incident light in a charge accumulation period. The signal charges generated by photoelectric conversion drift into the charge accumulation region 81 and are accumulated in the vicinity of the hole accumulation region 84 in the charge accumulation region 81.

In the charge accumulation period, a negative voltage is applied to the gate electrode of the transfer transistor 62 and the transfer transistor 62 is in an OFF state.

Next, a positive voltage is applied to the gate electrode of the transfer transistor 62 and the transfer transistor 62 is in an ON state at a read time. Consequently, signal charges accumulated in the light receiving unit 70 are transferred to the BCD unit 85.

For example, the positive charges are a power supply voltage (3.3V or 2.7V).

Here, the potential of the electrode 97 is changed according to an amount of signal charges transferred to the charge accumulation region 91 of the BCD unit 85. The potential of the electrode 97 is amplified by the amplification transistor 63 and a voltage corresponding to the potential is output to the vertical signal line 67.

Continuously, the signal charges transferred to the charge accumulation region 91 are swept into the reset drain unit 88 by applying a reset pulse ϕRG at a reset time.

At this time, the transfer transistor 62 is in the OFF state by applying a negative voltage to the gate electrode of the transfer transistor 62.

In the above-described charge accumulation period, the read operation and the reset operation are repeatedly performed.

In the solid-state imaging device according to the embodiment of the present invention, the charge accumulation region 91 is constituted in the $N^+$ type and the channel region 93 is constituted in the N type, so that all carriers of the two regions are electrons. Therefore, a gate area of the charge detection device can be reduced without constituting the electrode 98 functioning as the gate in the annular shape. The efficiency of conversion from signal charges into a voltage is increased with the reduction of the gate area of the charge detection device.

The solid-state imaging device according to the embodiment of the present invention is constituted to sweep signal charges into the reset drain unit 88 different from the drain region 94 after detecting the signal charge amount accumulated in the charge accumulation region 91. Therefore, power consumption can also be reduced.

That is, a current flows between the source and the drain in a sweep operation after detecting the signal charge amount since a signal charge sweep region is in common with the drain region of the transistor which detects the signal charge amount in the charge detection device of the BCD configuration of the related art. On the other hand, no current flows between the source and the drain in the sweep operation after detecting the signal charge amount since the drain region 94 and the reset drain unit 88 are separately disposed in the charge detection device of the solid-state imaging device according to the embodiment of the present invention. Therefore, power consumption can also be reduced as described above.

There is an advantage when the charge detection device is manufactured since the drain region 94 and the reset drain unit 88 can be separately disposed and the two can be independently manufactured.

That is, the drain region 94 and the reset drain region 88 can be simultaneously manufactured, or the drain region 94 and the reset drain region 88 can be separately manufactured, when the charge detection device is manufactured. Therefore, a formation method can be selected in response to a situation at the time of manufacturing the charge detection device, and there is an advantage when the charge detection device is manufactured as described above.

The reduction of random telegraph signal noise (RTS noise) considered as a factor of voltage drop in a silicon substrate interface can be promoted since there is adopted a configuration in which the channel region 93 is embedded in the P-type well 7.

MODIFIED EXAMPLE 1

In the third embodiment, an example in which the $N^+$-type charge accumulation region 91, the P-type channel barrier region 92, the N-type channel region 93, the $N^+$-type drain region 94, and the $N^+$-type source region 95 are disposed in the P-type well 7 has been described. That is, an example in which all carriers of the charge accumulation region 91 and the channel region 93 are electrons has been described. However, it is desirable for the carriers of the charge accumulation region 91 and the channel region 93 to be common, the carriers are not necessary to be electrons, and the carriers may be holes.

MODIFIED EXAMPLE 2

In the third embodiment, an example in which the channel region 93 is constituted to be embedded in the P-type well 7 has been described. However, it is enough if the carriers of the channel region 93 are in common with those of the charge accumulation region 91, and the channel region 93 is not necessary to be embedded in the P-type well 7. In this regard, it is desirable to constitute the channel region 93 to be embedded in the P-type well 7 in consideration of RTS noise reduction since RTS noise can be reduced by embedding the channel region 93 in the P-type well 7 as described above.

<4. Fourth Embodiment>
[Configuration of Imaging Device]

Figure 8:
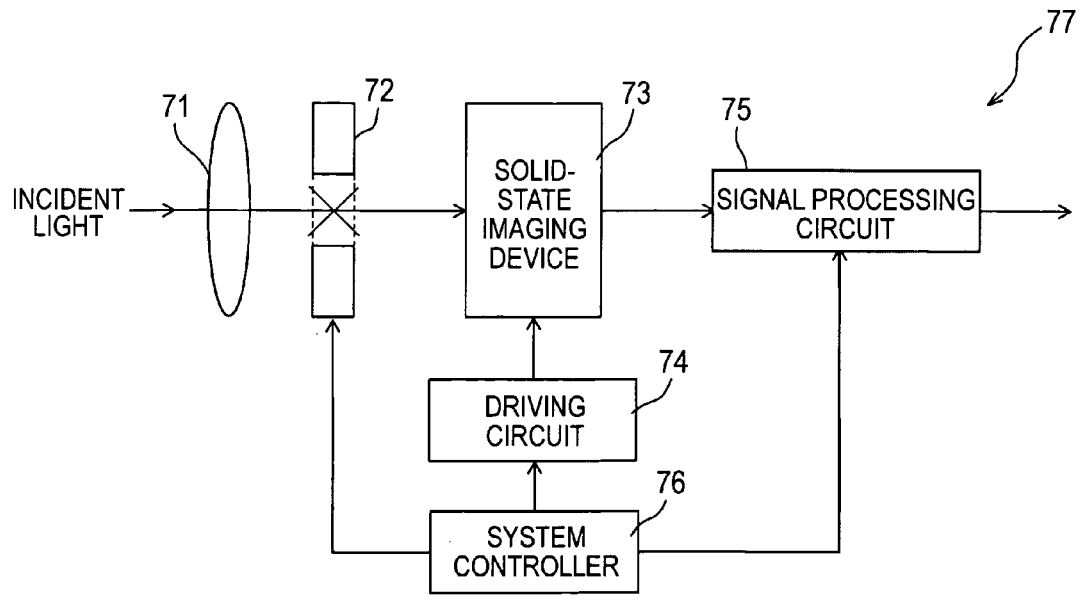
FIG. 8 is a schematic diagram illustrating a camera as an example of an image capturing device according to an embodiment of the present invention.
Figure 9:
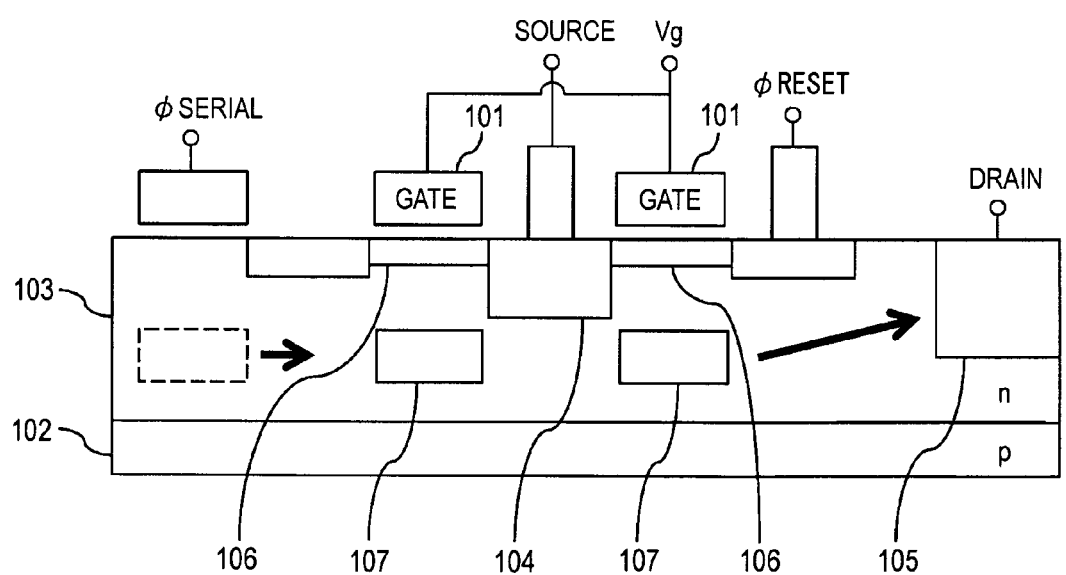
FIG. 9 is a schematic diagram illustrating the configuration of a solid-state imaging device using BCD of related art.

FIG. 8 is a schematic diagram illustrating a camera 77 as an example of the image capturing device according to the embodiment of the present invention. In the camera 77 illustrated here, the solid-state imaging device of the above-described third embodiment is used as the imaging device.

In the camera 77 according to the embodiment of the present invention, light from an object (not shown) is incident on an imaging area of a solid-state imaging device 73 through an optical system of a lens 71 and the like and a mechanical shutter 72. The mechanical shutter 72 is used to determine an exposure period by shielding light to the imaging area of the solid-state imaging device 73.

Here, the solid-state imaging device 73 uses the solid-state imaging device according to the above-described third embodiment and is driven by a driving circuit 74 including a timing generating circuit, a driving system, or the like.

After an output signal of the solid-state imaging device 73 is applied to various signal processes by a signal processing circuit 75 of the next stage, it is externally derived as a captured image signal. The derived captured image signal is stored in a storage medium such as a memory or the like and is output to a monitor.

A system controller 76 controls the opening/closing operation of the mechanical shutter 72, the driving circuit 74, the signal processing circuit 75, and the like.

Miniaturization and power consumption reduction can be realized since the camera according to the embodiment of the present invention adopts the solid-state imaging device according to the above-described embodiment of the present invention.

The present application contains subject matter related to that disclosed in Japanese Priority Patent Application JP 2009-028892 filed in the Japan Patent Office on Feb. 10, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A charge detection device comprising:
    a substrate having a first conductive type of predetermined region;
    a second conductive type of drain region disposed in the predetermined region of the substrate;
    a second conductive type of source region disposed in the predetermined region of the substrate;
    a second conductive type of channel region disposed between the drain region and the source region;
    a gate formed via an insulating film on the channel region;
    a second conductive type of charge accumulation region disposed in the predetermined region of the substrate and changing a threshold voltage of a transistor having the drain region, the source region, and the gate by accumulating signal charges as a target to be measured;
    a first conductive type of channel barrier region disposed between the channel region and the charge accumulation region; and
    a charge sweep region sweeping away the signal charges accumulated in the charge accumulation region.

2. The charge detection device according to claim 1, wherein the channel region is embedded in the predetermined region.

3. A charge detection method comprising the steps of:
    accumulating signal charges as a target to be measured in a second conductive type of charge accumulation region disposed in a first conductive type of predetermined region provided in a substrate;
    detecting a change of a threshold voltage occurring in a transistor by accumulating the signal charges in the charge accumulation region, wherein the transistor includes a second conductive type of drain region disposed in the predetermined region of the substrate, a second conductive type of source region disposed in the predetermined region of the substrate, and a gate formed via an insulating film on a second conductive type of channel region disposed between the drain region and the source region, wherein a first conductive type of channel barrier region is disposed between the channel region and the charge accumulation region; and sweeping the signal charges accumulated in the charge accumulation region into a charge sweep region different from the drain region.

4. A solid-state imaging device comprising:
a substrate having a first conductive type of predetermined region;
a photoelectric conversion element disposed in the predetermined region of the substrate and generating signal charges in response to incident light;
a second conductive type of drain region disposed in the predetermined region of the substrate;
a second conductive type of source region disposed in the predetermined region of the substrate;
a second conductive type of channel region disposed between the drain region and the source region;
a gate formed via an insulating film on the channel region;
a second conductive type of charge accumulation region disposed in the predetermined region of the substrate and changing a threshold voltage of a transistor having the drain region, the source region, and the gate by accumulating the signal charges generated by the photoelectric conversion element;
a first conductive type of channel barrier region disposed between the channel region and the charge accumulation region; and
a charge sweep region sweeping away the signal charges accumulated in the charge accumulation region.

5. A method of driving a solid-state imaging device comprising the steps of:
generating signal charges in response to incident light by a photoelectric conversion element disposed in a first conductive type of predetermined region provided in a substrate;
accumulating the signal charges generated by the photoelectric conversion element in a second conductive type of charge accumulation region disposed in the predetermined region of the substrate;
detecting a change of a threshold voltage occurring in a transistor by accumulating the signal charges in the charge accumulation region, wherein the transistor includes a second conductive type of drain region disposed in the predetermined region of the substrate, a second conductive type of source region disposed in the predetermined region of the substrate, and a gate formed via an insulating film on a second conductive type of channel region disposed between the drain region and the source region, wherein a first conductive type of channel barrier region is disposed between the channel region and the charge accumulation region; and
sweeping the signal charges accumulated in the charge accumulation region into a charge sweep region different from the drain region.

6. An imaging device comprising:
a solid-state imaging device; and
an optical system guiding incident light to a photoelectric conversion element;
wherein the solid-state imaging device includes
a substrate having a first conductive type of predetermined region,
the photoelectric conversion element disposed in the predetermined region of the substrate and generating signal charges in response to the incident light,
a second conductive type of drain region disposed in the predetermined region of the substrate,
a second conductive type of source region disposed in the predetermined region of the substrate,
a second conductive type of channel region disposed between the drain region and the source region,
a gate formed via an insulating film on the channel region,
a second conductive type of charge accumulation region disposed in the predetermined region of the substrate and changing a threshold voltage of a transistor having the drain region, the source region, and the gate by accumulating the signal charges generated by the photoelectric conversion element,
a first conductive type of channel barrier region disposed between the channel region and the charge accumulation region, and
a charge sweep region sweeping away the signal charges accumulated in the charge accumulation region.

* * * * *